(12) United States Patent
Tsironis (10) Patent No.: US 11,662,364 B1
(45) Date of Patent: May 30, 2023

(54) INTEGRATED WAVEGUIDE TUNER

(71) Applicant: Christos Tsironis, St-Laurent (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 17/544,312

(22) Filed: Dec. 7, 2021

(51) Int. Cl.
*G01R 1/067* (2006.01)
*H01P 5/08* (2006.01)
*H01P 3/12* (2006.01)

(52) U.S. Cl.
CPC .......... *G01R 1/06772* (2013.01); *H01P 3/121* (2013.01); *H01P 5/08* (2013.01)

(58) Field of Classification Search
CPC .............................. G01R 1/06772; H01P 5/08
See application file for complete search history.

(56) References Cited

U.S. PATENT DOCUMENTS 5,910,754 A   6/1999   Simpson et al.
6,674,293 B1  1/2004   Tsironis
9,620,842 B1* 4/2017   Tsironis .................. H03H 7/40
10,345,422 B1* 7/2019  Tsironis ............ G01R 31/2612
10,637,122 B1* 4/2020  Tsironis .................. H03J 1/06

OTHER PUBLICATIONS

"Load Pull Measurements" [online], Wikipedia [retrieved on Nov. 18, 2016] Retrieved from Internet <URL:http://en.wikipedia.org/wiki/Load_pull>.
W Band Programmable Tuner Model 11075, Product Note 43, 1997, Focus Microwaves.
"Linear Actuator" [online], Wikipedia [retrieved on Apr. 25, 2020]. Retrieved from Internet <URL: https://en.wikipedia.org/wiki/Linear_actuator>.

* cited by examiner

*Primary Examiner* — Paresh Patel (57) ABSTRACT

A wafer probe-to-waveguide adapter is transformed to a load pull device by integrating in the straight section of the waveguide a two-slug tuner with fixed penetration into diametral slots in the waveguide controlled by linear stepper actuators crossing over and sharing the same section of the waveguide.

5 Claims, 10 Drawing Sheets

INTEGRATED WAVEGUIDE TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. W Band Programmable Tuner Model 11075, PN-43, Focus Microwaves August 1997.
3. Tsironis C., U.S. Pat. No. 6,674,293, "Adaptable Pre-Matched Tuner System and Method".
4. Simpson et al., U.S. Pat. No. 5,910,754, "Reduced height waveguide tuner for impedance matching", FIG. 8.
5. "Linear Actuator" [online], Wikipedia [retrieved on Apr. 25, 2020]. Retrieved from Internet <URL: https://en.wikipedia.org/wiki/Linear_actuator>.

BACKGROUND OF THE INVENTION

This invention relates to load and source pull testing of RF and millimeter-wave transistors and amplifiers using remotely controlled electro-mechanical waveguide impedance tuners.

Figure 1:
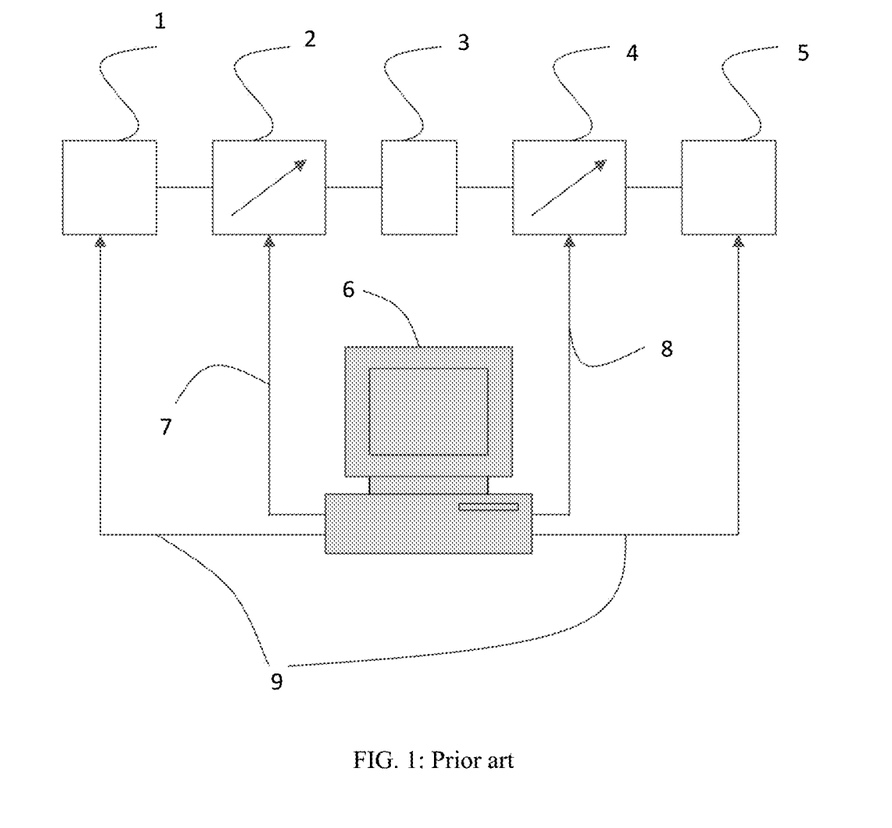
FIG. 1 depicts prior art: a typical generic automated load pull test system.

A popular method for testing and characterizing RF and millimeter-wave transistors in their non-linear region of operation is "load pull" (see ref. 1). Load pull is a device measurement technique employing microwave impedance (load-pull) tuners and other microwave test equipment as shown in FIG. 1. The waveguide tuners 2, 4 (see ref 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which includes an electronic interface to communicate with the instruments 1, 5 and the tuners 2, 4 using digital control and communication cables 7, 8 and 9.

DESCRIPTION OF PRIOR ART

Figures 2A, 2B:
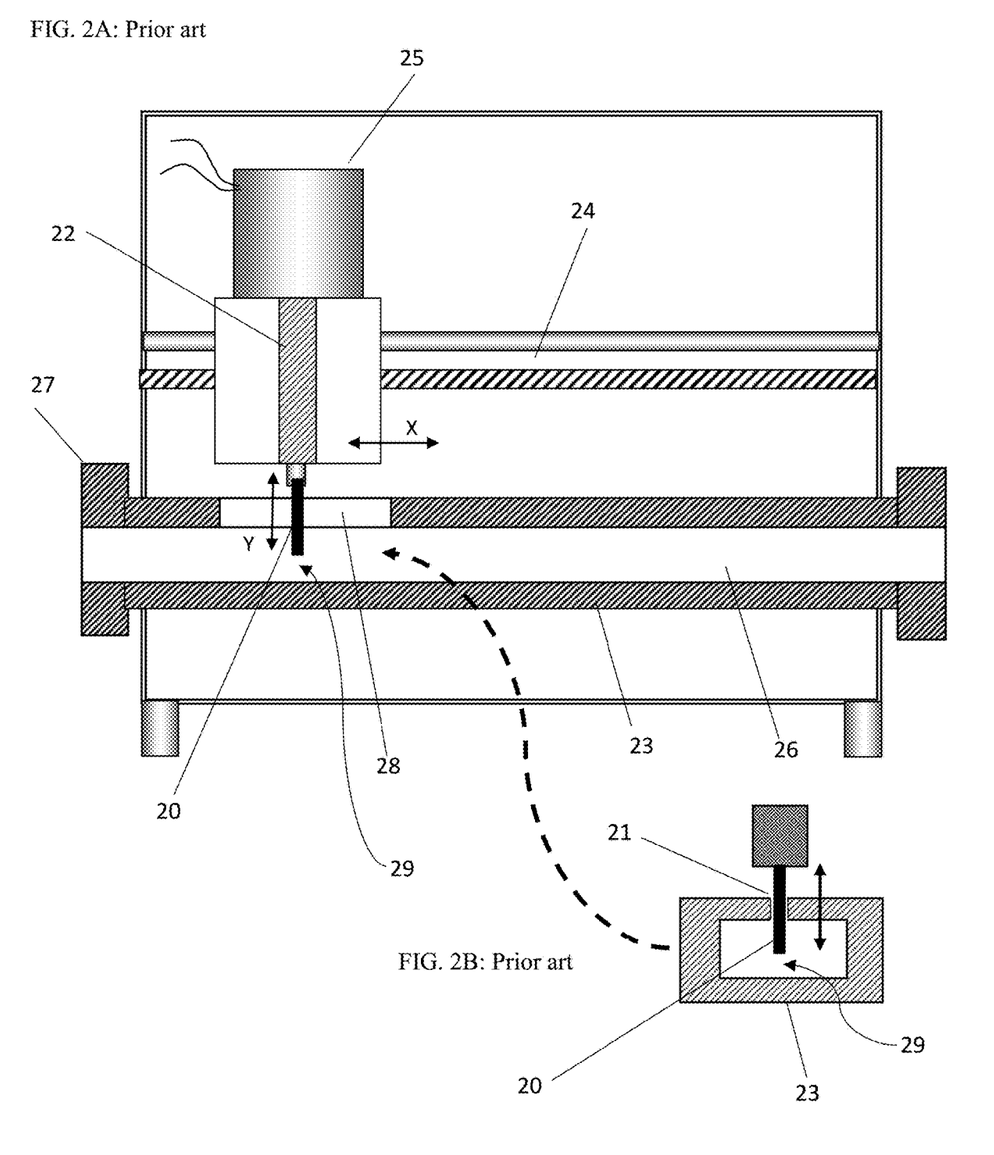
Figure 3:
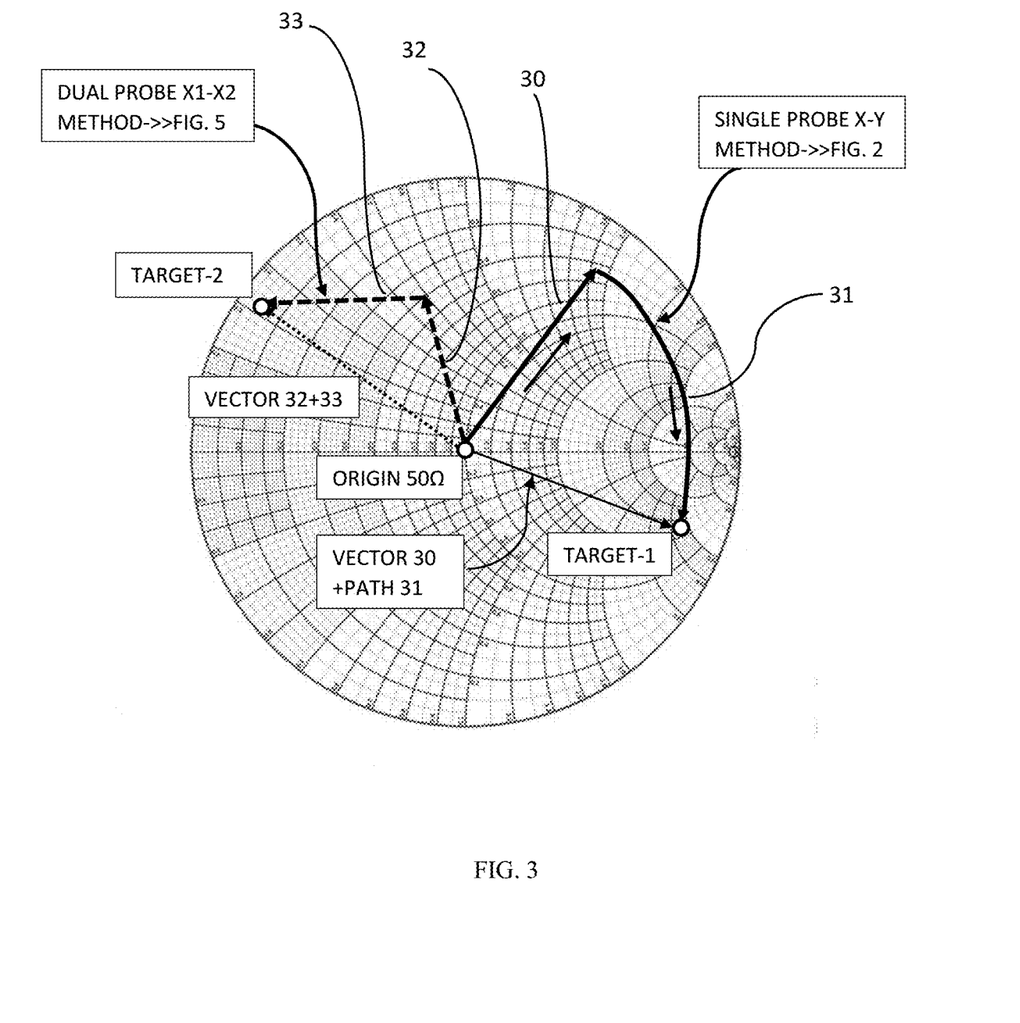
FIG. 3 depicts partly prior art: a Smith chart and two possible trajectories of impedance synthesis (tuning) to reach a target impedance starting from the origin of 50Ω. Reaching target-1 uses the prior art single-probe technique with horizontal and vertical control; reaching target-2 uses the new two-probe technique with horizontal only and no vertical control.

Waveguide impedance tuners include, in general, a low-loss transmission line 26, which has a broad top wall, a broad bottom wall and two narrow side walls, FIG. 2, and a conductive tuning element (tuning probe, 20) inserted in a slot 28 machined into the top broad wall of the waveguide 23; the probe 20 is an at least partly conductive rod, block or bar, is attached to a complex, adjustable high precision motor-controlled 25 vertical axis Y and is inserted vertically into the slot 28 and moved along the axis X of the waveguide this movement of the tuning probe creates, in a certain frequency range, a controllable variable reactance which, combined with the following matched load allows the synthesis of various impedances (or reflection factors) which are present at the test port 27, covering up to the quasi totality of the Smith chart (the polar impedance mapping display shown as normalized reflection factor, FIG. 3). The impedance synthesis follows a path 30, 31 between the matched load at the origin (50 Ω) and an arbitrary target 1. Inserting the tuning probe into the slot follows path 30 and moving it along the slot follows path 31. The relation between reflection factor Γ and impedance Z is given by $\Gamma=(Z-Zo)/(Z+Zo)$, wherein $Z=R+jX$ and wherein Zo is the characteristic impedance. A typical value used for Zo is 50 Ω.

Figure 7:
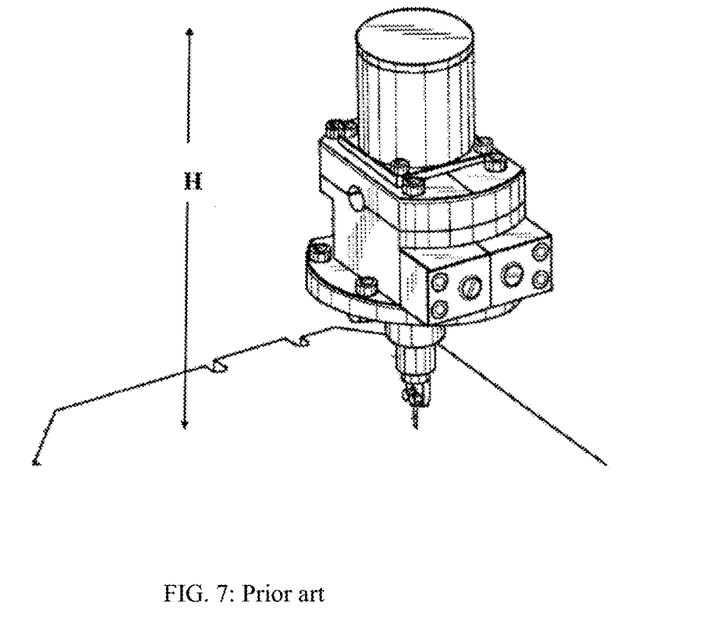
FIG. 7 depicts prior art: vertical axis of waveguide slide screw tuner.

When conductive tuning probes (typically rods) 20, FIG. 2, penetrate the waveguide cavity of the transmission line 26, they capture and deform the electric field, which is concentrated in the area 29 between the bottom tip of the probe 20 and the ground plane 23 of the waveguide. This field deformation creates a capacitive effect, sends injected signal power back and allows generating high and controllable reflection factors. The main disadvantage of this embodiment is the requirement for high precision and resolution and, by consequence, tall and cumbersome vertical probe movement mechanisms 22, FIG. 7 and ref 4, which must be extremely precise over their entire travel range and able to fully insert or extract the tuning probe from the waveguide cavity, since the significant portion of reflection occurs when the probe tip is very close to the bottom inner wall of the waveguide (ground plane). This movement process slows down the tuning procedure for two reasons: (a) when the probe is withdrawn, the vertical movement is lengthy and much less effective in terms of generating useful reflection factor, and (b), because the vertical moving resolution is constant, enhanced positioning accuracy and resolution are required all the way due to high tuning sensitivity in the high reflection area, when the probe is deeply inserted and close to the ground plane.

Related prior art (see ref. 3) does not teach impedance tuners with fixed penetration (or vertical position) dual tuning probes; prior art tuners require at least one high precision complex vertical axis to be able to create path 30 in FIG. 3 and tune. Neither relevant prior art ref. 3 or 4 teach a compact tuner using alternatively swapping and crossing-over tuning probes in a shared transmission line structure. This overlapping structure, though, is essential, compatible with the proposed low profile compact size tuner and attractive, because of high-speed adaptive tuner calibration and operation (see ref 3).

BRIEF SUMMARY OF THE INVENTION

Figure 8A:
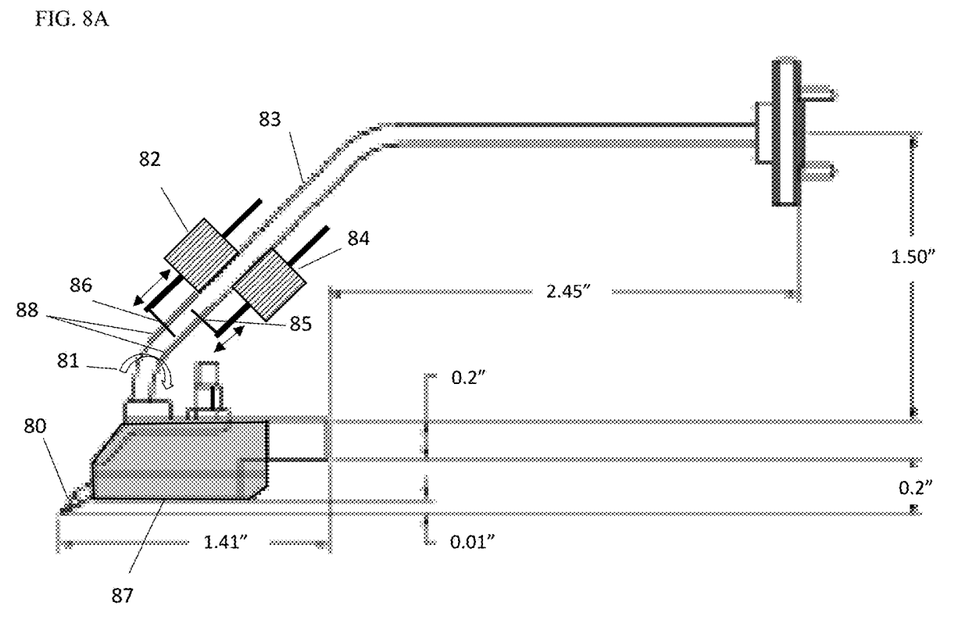
Figure 9:
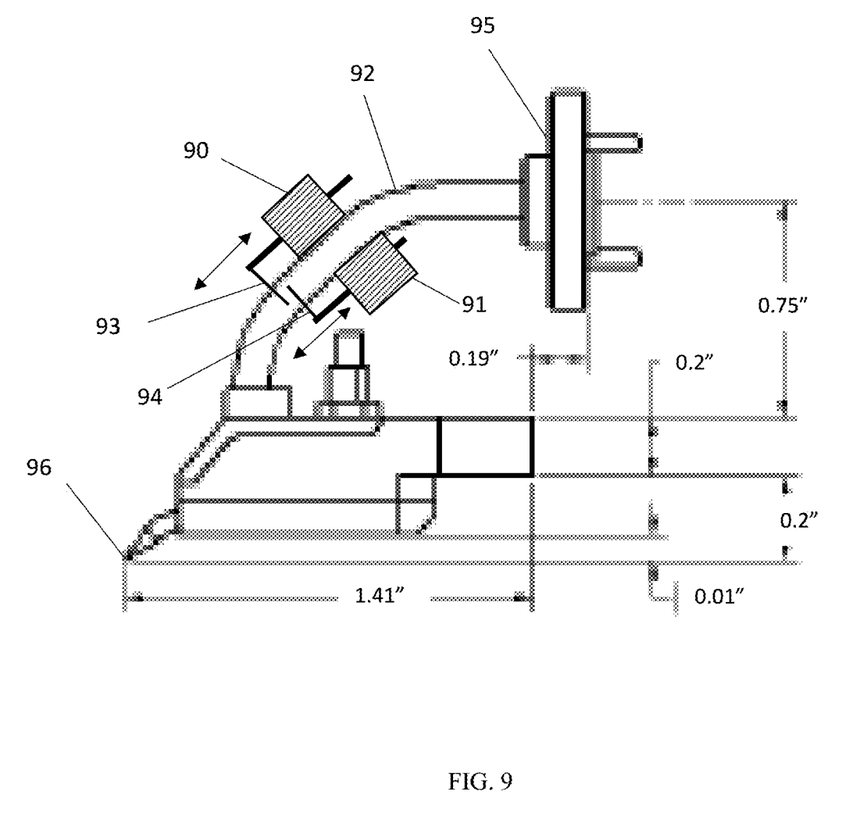
FIG. 9 depicts a side view of an alternative wafer-probe to waveguide adapter with integrated load pull tuner.

The invention discloses a new type of waveguide-to-wafer probe adapter with integrated load pull slide screw tuner (FIGS. 8A and 9). The tuner configuration, different from prior art, uses horizontally-only moving high-speed control techniques of the tuning probes.

Figure 4:
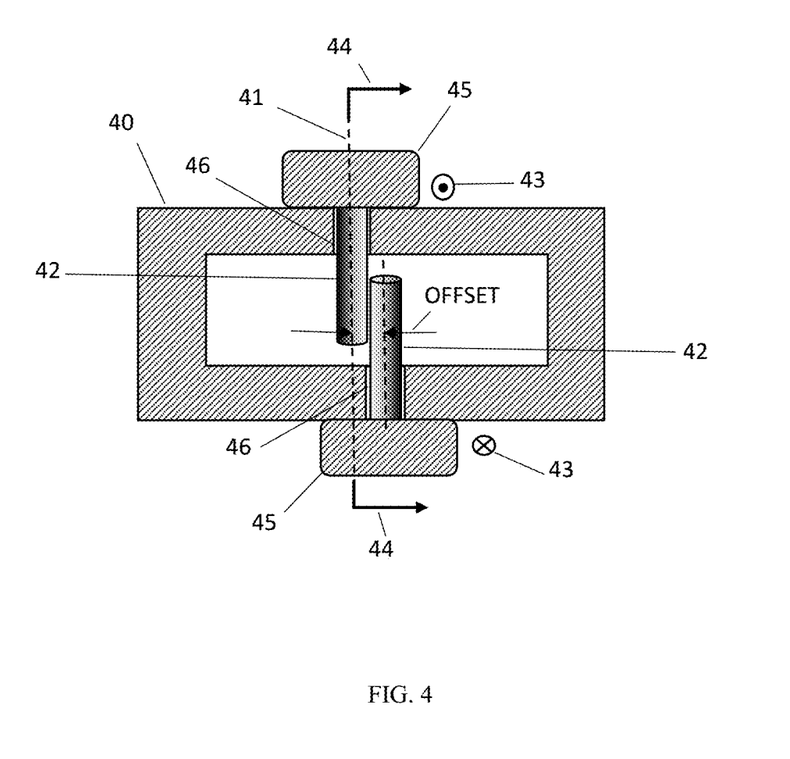
FIG. 4 depicts a cross-section through a waveguide with two conductive tuning rods.

The impedance tuner itself, of which a conceptual cross section is shown in FIG. 4, uses a bent low loss waveguide transmission line 40 and two diametrical tuning probes 42. The tuning probes 42 are, typically, at least partially conductive rods and are mounted on mobile sliding carriages 45. The carriages are placed facing each other across the waveguide and slide 43 seamlessly and precisely along the waveguide top and bottom walls guided by high precision sliders controlled by the stepper actuators 54 (see ref. 5). They hold the tuning probes (conductive rods) 42 and keep them inserted into the waveguide cavity at a fixed depth through vertical slots 46, non-contacting with the slot walls 21. The slots run parallel to the axis of the waveguide. This tuning mechanism does not require any vertical probe control. In order to allow the tuning rods to cross over without mechanical conflict, the slots are slightly offset of the center line of the waveguide, by at least one diameter (thickness) of a tuning rod or block. A medium size reflection (S11≈0.7-0.8) is created by either tuning probe leading to a new tuning mechanism as shown in FIG. 3 (traces 32, 33). Both tuning mechanisms shown in FIG. 3 yield the same result: starting from the matched load (50Ω) they allow tuning to target-1 or target-2. The result is the same, only the control mechanisms differ.

The carriages 45, 52, 53 are controlled using high-speed stepper actuators 54 (see ref. 5) eliminating this way additional control gear. Last, not least, the tuning mechanism, liberated from cumbersome and expensive high resolution vertical probe control and movement delays, benefits also from inherent lower tuning error sensitivity to mechanical probe positioning tolerances close to |Γ|≈1.

BRIEF DESCRIPTION OF THE SEVERAL VIEWS OF THE DRAWINGS

The invention and its mode of operation will be better understood from the following detailed description when read with the appended drawings, in which:

FIGS. 2A through 2B depict prior art: a single probe waveguide impedance tuner; FIG. 2A depicts a front view of the entire tuner; FIG. 2B depicts a cross section of the tuning probe (typically a conductive rod) entering the waveguide slot.

FIGS. 8A through 8B depict the integration of tuner in wafer probe waveguide adapter; FIG. 8A depicts a side view; FIG. 8B depicts a top view.

DETAILED DESCRIPTION OF THE INVENTION

This invention discloses a high frequency (microwave, millimeter wave), wafer-probe to waveguide adapter with integrated computer-controlled impedance tuner, suitable for load pull measurements. The tuner (FIGS. 4 and 5) uses the adapter waveguide-transmission line 40, which includes two broad top walls, two narrow side walls and two slots 46 cut into the broad walls, one on the top and one on the bottom (see cross section 41, 44 in FIG. 5). The slots run parallel to the waveguide longitudinal axis and are positioned opposite to each other and slightly offset from the symmetry center line of the waveguide. The offset eccentricity is selected to allow two tuning probes (typically metallic or metallized rods 42) to cross over (pass next to each other) without touching. This structure is chosen for economy of limited space (FIG. 9), because it uses slots of a total length of one half of a wavelength 56 at the lowest frequency of operation (Fmin) plus the thickness of one tuning rod. The horizontal control of the carriages 52 and 53 is ensured using miniature stepper actuators 54. An alternative configuration, where the slots would be on the same broad wall and the tuning rods would not cross over, would, in principle, also work, but the slot plus the actuator would have to be twice as long, which in our case of a waveguide adapter is not available.

Figure 5:
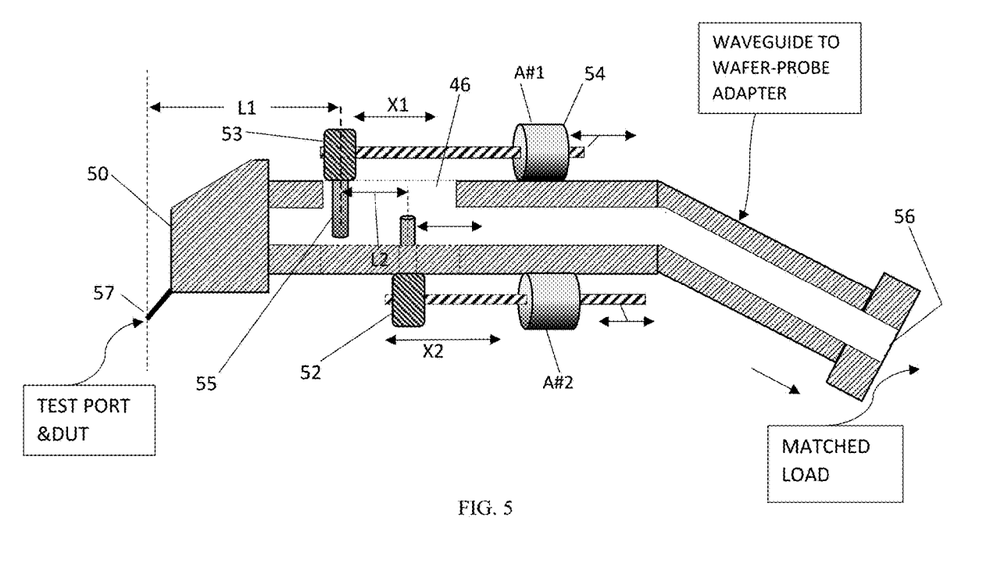
FIG. 5 depicts a side view of the waveguide tuner with two crossing over tuning probes.

FIG. 5 shows a front view cut through the wafer probe-waveguide adapter with integrated load pull tuner; the two actuators A#1 (54) and A#2 control an ACME rod, on which are attached the small carriage blocks 52 and 53, which hold the tuning probes 55 and slide smoothly on a straight section of the external broad waveguide wall in which two diametral slots 46 have been machined. The slots are slightly offset (see FIG. 4), therefore the lower slot is not visible in FIG. 5. The waveguide is bent and terminates with the wafer probe 50 towards the DUT, which is accessed via the probe tips 57, and towards the auxiliary equipment via the waveguide flange 56. The tuning probes are inserted to a fixed depth inside the slots and move only horizontally and may cross over each other. The distances L1 and L2 determine the tuning state. L1 is chosen to be as small as possible. L2 varies between 0 and λ/2 at any test frequency. The position of the tuning probes is given by coordinates X1 and X2 and by convention it is agreed that if X1<X2 then probe 1 (55) is closer to the test port (or DUT) and if X2<X1 then probe 2 (52) is closer.

Figure 6:
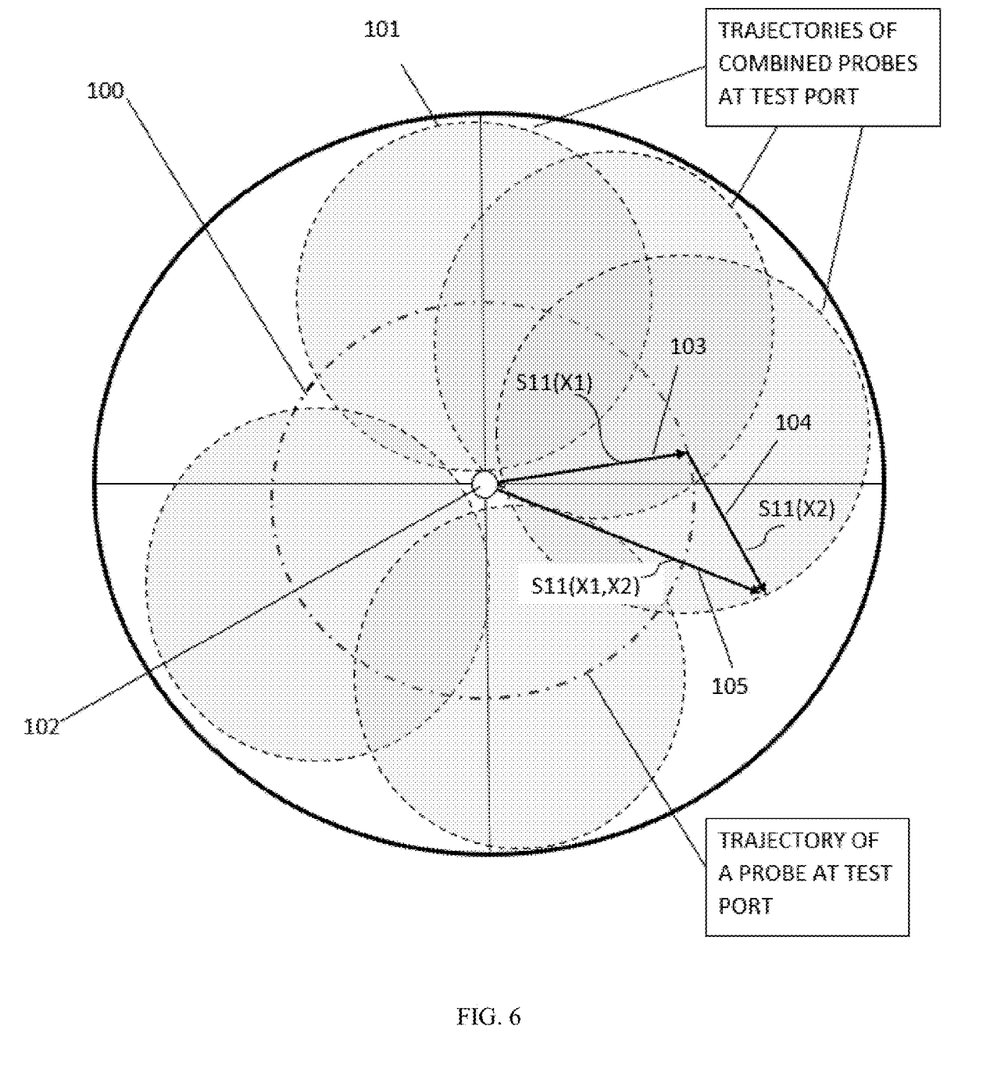
FIG. 6 depicts the Smith chart coverage mechanism using two-probe impedance tuner with fixed probe penetration.

FIG. 6 shows how the two crossing over tuning probes inserted at a constant depth into the slots create reflection factors 101 covering the whole area if the Smith chart: one probe creates a circle 100 around the center 102, this is vector 103; the second probe rotates around a point on the trajectory 100 and creates a vector 104. The vectorial sum of both creates the total reflection 105. If vectors 103 and 104 are in phase we get maximum reflection; if they are in opposite phase, we get zero (or the center 102 of the Smith chart). It is obvious that this epicycloid movement covers the entire Smith chart completely, or S11(X1,X2)=S11(X1)+S11(X2), all referred to the DUT (or test port) reference plane.

Figure 8B:
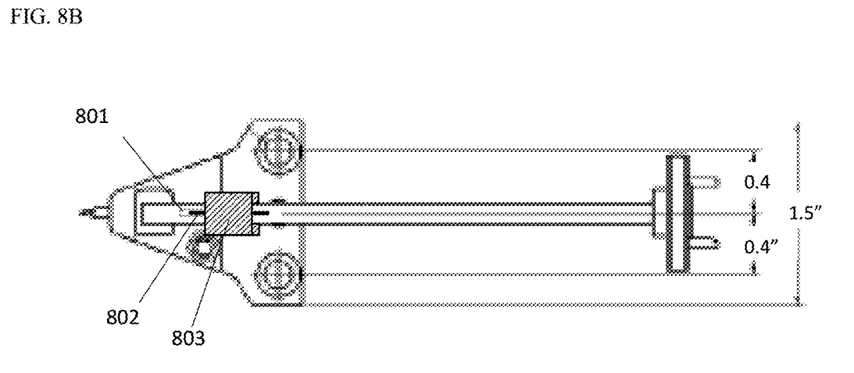

FIG. 8 shows an embodiment of the wafer-probe to waveguide adapter with integrated load pull tuner. The tips 80 of the wafer probe are transited inside the body 87 to waveguide 83; the straight waveguide section 83 is slotted close to the bend into the top and bottom broad surface slightly offset and at least λ/2 long parallel to the axis of the waveguide. The two actuators 82 and 84 are mounted on the opposite broad surfaces of the waveguide and hold the tuning probes 85 and 86 secured inside the slots 88 at a fixed depth and movable along the slots of the waveguide. The vectorial sum of the reflection of both tuning probes creates the total reflection 81. The whole assembly makes up the wafer-probe to waveguide adapter with integrated load pull tuner. FIG. 8B depicts a top view of the assembly of FIG. 8A, we recognize the top slot 801, the tuning probe holder 802 and the top actuator 803.

The same embodiment on a shorter adapter is shown in FIG. 9: The actuators 90, 91 are mounted on the linear section of the waveguide 92 and control tuning probes 93, 94 as in FIG. 8A. The waveguide flange 95 and probe tips 96 are also shown and define the test and idle ports of the adapter.

Figure 10:
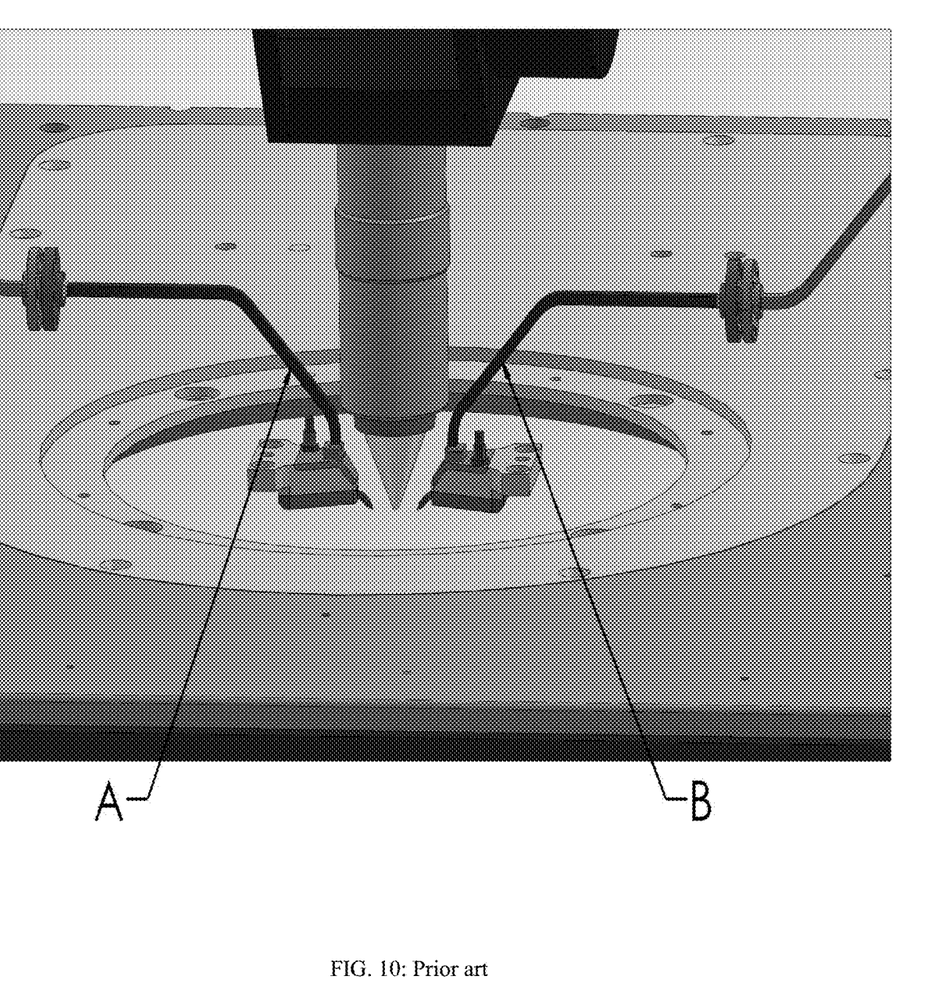
FIG. 10 depicts a commercially available system setup.

FIG. 10 shows a real commercially available test assembly and the benefit of integrating the tuner at positions A and B much closer to the wafer-probes as before possible is obvious.

Obvious alternative embodiments to the herein described wafer probe to waveguide adapter with integrated automated load pull tuner shall not impede the value of the invention.

What is claimed is:

1. A wafer probe to waveguide adapter comprising:

a bent waveguide transmission line between a waveguide flange and the wafer probe and an integrated automated slide screw tuner, having two remotely controlled tuning probes;

wherein the waveguide transmission line has two broad walls, a top broad wall, and a bottom broad wall, and two narrow sidewalls, and two slots parallel to a longitudinal axis of the waveguide transmission line, placed facing each-other, one on the top and one on the bottom broad wall;

wherein the slots are positioned offset of a center line of the waveguide transmission line by at least a thickness of the tuning probes, and wherein two remotely controlled stepper actuators A#1 and A#2 are mounted opposite to each-other, one on the top broad wall and one on the bottom broad wall, and control associated tuning probes P#1 and P#2, which are inserted diametrical into the slots at a fixed penetration into and move along the waveguide transmission line, sharing this way a section of the waveguide transmission line;

and wherein actuator A#1 moves probe P#1 to a position X1, and actuator A#2 moves probe P#2 to a position X2.

2. The wafer probe to waveguide adapter of claim 1, wherein the slots are at least one half of a wavelength ($\lambda/2$) long at a lowest frequency of operation (Fmin).

3. The wafer probe to waveguide adapter of claim 1, wherein the tuning probes are at least partly metallic or metallized rods.

4. The wafer probe to waveguide adapter of claim 1, wherein the tuning probes are at least partly metallic or metallized blocks.

5. The wafer probe to waveguide adapter of claim 1, wherein the tuning probes traverse the slots in a contactless manner.

* * * * *